United States Patent
Lee et al.

(10) Patent No.: US 8,441,116 B2
(45) Date of Patent: May 14, 2013

(54) SEMICONDUCTOR PACKAGE HAVING SUBSTRATE FOR HIGH SPEED SEMICONDUCTOR PACKAGE

(75) Inventors: Woong Sun Lee, Gyeonggi-do (KR); Qwan Ho Chung, Gyeonggi-do (KR); Il Hwan Cho, Gyeonggi-do (KR); Sang Joon Lim, Gyeonggi-do (KR); Jong Woo Yoo, Seoul (KR); Jin Ho Bae, Gyeonggi-do (KR); Seung Hyun Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/465,274

(22) Filed: May 7, 2012

(65) Prior Publication Data

US 2012/0217637 A1     Aug. 30, 2012

Related U.S. Application Data

(62) Division of application No. 12/049,661, filed on Mar. 17, 2008, now abandoned.

(30) Foreign Application Priority Data

Dec. 13, 2007 (KR) .................. 10-2007-0129658

(51) Int. Cl.
*H01L 23/48* (2006.01)
(52) U.S. Cl.
USPC ........................................ 257/690; 257/686
(58) Field of Classification Search ............... 257/686, 257/690
See application file for complete search history.

(56) References Cited

U.S. PATENT DOCUMENTS

| 4,879,433 A | 11/1989 | Gillett et al. |
| 6,229,217 B1 | 5/2001 | Fukui et al. |
| 6,233,157 B1 * | 5/2001 | Yoon et al. ............... 361/760 |

(Continued)

FOREIGN PATENT DOCUMENTS

| KR | 1020050003892 A | 1/2005 |
| KR | 1020050024017 A | 3/2005 |

(Continued)

OTHER PUBLICATIONS

USPTO RR mailed Jul. 20, 2010 in connection with U.S. Appl. No. 12/049,661.

(Continued)

*Primary Examiner* — David Vu
*Assistant Examiner* — Caleb Henry
(74) *Attorney, Agent, or Firm* — Ladas & Parry LLP

(57) ABSTRACT

The substrate for a semiconductor package includes a substrate body having a first surface and a second surface opposite to the first surface. Connection pads are formed near an edge of the first surface. Signal lines having conductive vias and first, second, and third line parts are formed. The first line parts are formed on the first surface and are connected to the connection pads and the conductive vias, which pass through the substrate body. The second line parts are formed on the first surface and connect to the conductive vias. The third line parts are formed on the second surface and connect to the conductive vias. The second and third line parts are formed to have substantially the same length. The semiconductor package utilizes the above substrate for processing data at a high speed.

17 Claims, 6 Drawing Sheets

U.S. PATENT DOCUMENTS

| | | | |
|---|---|---|---|
| 6,335,491 B1 * | 1/2002 | Alagaratnam et al. | 174/260 |
| 6,366,466 B1 * | 4/2002 | Leddige et al. | 361/760 |
| 6,399,416 B1 | 6/2002 | Wark | |
| 6,424,034 B1 * | 7/2002 | Ahn et al. | 257/723 |
| 6,468,831 B2 | 10/2002 | Leong et al. | |
| 6,472,736 B1 | 10/2002 | Yeh et al. | |
| 6,640,332 B2 | 10/2003 | Mitome et al. | |
| 6,876,088 B2 * | 4/2005 | Harvey | 257/778 |
| 7,045,893 B1 * | 5/2006 | Paek et al. | 257/737 |
| 7,180,752 B2 * | 2/2007 | Chamberlin et al. | 361/790 |
| 7,368,374 B2 | 5/2008 | Chia et al. | |
| 7,603,772 B2 * | 10/2009 | Farnworth et al. | 29/852 |
| 2003/0057538 A1 * | 3/2003 | Watson | 257/686 |
| 2003/0122240 A1 * | 7/2003 | Lin et al. | 257/686 |
| 2003/0178716 A1 * | 9/2003 | Maeda et al. | 257/686 |
| 2003/0231473 A1 | 12/2003 | Otaki et al. | |
| 2004/0065711 A1 * | 4/2004 | Sung | 228/4.5 |
| 2004/0173914 A1 * | 9/2004 | Kurihara et al. | 257/778 |
| 2005/0001638 A1 * | 1/2005 | Miller et al. | 324/754 |
| 2005/0212114 A1 * | 9/2005 | Kawano et al. | 257/690 |
| 2007/0001280 A1 * | 1/2007 | Hua | 257/686 |
| 2007/0089290 A1 * | 4/2007 | Lauffer et al. | 29/830 |
| 2007/0152313 A1 * | 7/2007 | Periaman et al. | 257/686 |
| 2007/0222050 A1 * | 9/2007 | Lee et al. | 257/678 |
| 2009/0127692 A1 * | 5/2009 | Kawate et al. | 257/692 |

FOREIGN PATENT DOCUMENTS

| | | |
|---|---|---|
| KR | 100650769 B1 | 11/2006 |
| KR | 1020070005745 A | 1/2007 |
| KR | 1020070079654 A | 8/2007 |

OTHER PUBLICATIONS

USPTO NFOA mailed Oct. 13, 2010 in connection with U.S. Appl. No. 12/049,661.

USPTO FOA mailed Mar. 10, 2011 in connection with U.S. Appl. No. 12/049,661.

USPTO FOA mailed Aug. 16, 2011 in connection with U.S. Appl. No. 12/049,661.

USPTO FOA mailed Feb. 10, 2012 in connection with U.S. Appl. No. 12/049,661.

\* cited by examiner

US 8,441,116 B2

SEMICONDUCTOR PACKAGE HAVING SUBSTRATE FOR HIGH SPEED SEMICONDUCTOR PACKAGE

CROSS-REFERENCE TO RELATED APPLICATIONS

The present application claims priority to Korean patent application number 10-2007-0129658 filed on Dec. 13, 2007, which is incorporated herein by reference in its entirety.

BACKGROUND OF THE INVENTION

The present invention relates generally to a substrate for a semiconductor package and a semiconductor package have the same.

Semiconductor device manufacturing technologies continue to develop, and as a result, semiconductor packages suitable for processing greater amounts of data in shorter periods of time are being disclosed in the art.

The manufacture of semiconductor packages is a multiple step process. For example, the process may include performing a manufacturing process for forming semiconductor chips on a wafer of silicon having high purity. Next, for example, a die sorting process for electrically inspecting the semiconductor chips may be performed. Thereafter, for example, a packaging process for packaging good quality semiconductor chips may be performed.

Recently, a chip scale package, which has a size corresponding to about 100% to 105% of the size of a semiconductor chip, and a stacked semiconductor package, in which a plurality of semiconductor chips are stacked on one another, have been developed.

The stacked semiconductor package has advantages in that it significantly increases the capacity for storing data. However, the stacked semiconductor package likely results in deteriorated data processing speed due to differences in speeds for processing the signals inputted to and outputted from the respective semiconductor chips included in the stacked semiconductor package.

SUMMARY OF THE INVENTION

An embodiment of the present invention is directed to a substrate for a semiconductor package suitable for processing data at a high speed.

Also, embodiments of the present invention are directed to a semiconductor package having a substrate suitable for processing data at a high speed.

In one aspect, a substrate for a semiconductor package comprises a substrate body having a first surface and a second surface on the opposite side of the first surface; a plurality of connection pads formed near an edge of the first surface; and a plurality of signal lines, each signal line having first line parts having an first end and a second end formed on the first surface, wherein the first end of the first line part is connected to a predetermined one of the connection pads, a conductive via formed to pass through the first surface, the second surface, and the substrate body, wherein the conductive via is connected to the second end of the first line part on the first surface, a second line part having a first end and a second end formed on the first surface, wherein the first end of the second line part is connected to the conductive via on the first surface, and a third line part having a first end and a second end formed on the second surface, wherein the first end of the third line part is connected to the conductive via on the second surface and the third line part and the second line part have substantially the same length.

Each first line part is formed along a central portion of the first surface.

Each third line part is formed to connect to a predetermined one of the conductive vias and each third line part extends along the second surface, and the second line part connected to the predetermined one of the conductive vias extends along the first surface in the opposite direction.

The substrate further comprises a plurality of first ball lands formed on the first surface, wherein each first ball land is formed on the second end of a predetermined one of the second line parts; and a plurality of second ball lands formed on the second surface, wherein each second ball land is formed on the second end of a predetermined one of the third line parts.

The substrate further comprises a first solder resist pattern formed on the first surface and having a plurality of first openings such that the first openings expose each of the connection pads and each of the first ball lands; and a second solder resist pattern formed on the second surface and having a plurality of second openings such that the second openings expose each of the second ball lands.

In another aspect, a semiconductor package comprises a sub-semiconductor package including semiconductor chips and a sub-substrate, the semiconductor chips comprising a first semiconductor chip which has first bonding pads facing a first surface of the sub-substrate and a second semiconductor chip which has second bonding pads facing a second surface of the sub-substrate, wherein the second bonding pads are formed to directly correspond and align with the first bonding pads, and a sub-substrate including a sub-substrate body having a first surface and a second surface on the opposite side of the first surface wherein the sub-substrate body is interposed between the first and second bonding pads, a plurality of sub-connection pads formed near an edge of the first surface, and a plurality of signal lines, each signal line comprising a first line part having a first end and a second end formed on the first surface, wherein the first end of each first line part is connected to a predetermined one of the sub-connection pads, a conductive via formed through the first surface, the second surface, and the sub-substrate body, wherein the conductive via is connected to the second end of the first line part on the first surface; a second line having a first end and a second end formed on the first surface, wherein the first end of the second line part is connected to the conductive via and the second end of the second line part is connected to a predetermined one of the first bonding pads; and a third line part having a first and second end formed on the second surface, wherein the first end of the third line part is connected to the conductive via and the second end of the third line part is connected to a predetermined one of the second bonding pads; and a main substrate supporting the sub-semiconductor package and having connection pads which are connected to the sub-connection pads.

The each of the first line parts extend toward a central portion of the sub-substrate body.

Each second line part is formed to connect to a predetermined one of the conductive vias and each second line part extends along the first and the third line part connected to the predetermined one of the conductive vias extends along the second surface in the opposite direction.

The sub-semiconductor package further includes a plurality of first ball lands formed on the first surface, wherein each first ball land is formed on the second end of a predetermined one of the second line parts, and a plurality of second ball lands formed on the second surface, wherein each second ball land is formed on the second ends of a predetermined one of the third line parts.

The sub-semiconductor package further includes a first solder resist pattern formed on the first surface and having first openings formed to correspond to each of the sub-connection pads and each of the first ball lands, and a second solder resist pattern formed on the second surface and having second openings formed to correspond to each of the second ball land patterns.

The sub-connection pads of the sub-substrate are connected to the connection pads of the main substrate by conductive connection members.

Each conductive connection member comprises any one of a conductive wire, a conductive pin, a conductive ball, and a conductive bump.

The semiconductor package further comprises a gap-maintaining member interposed between the main substrate and the sub-semiconductor package to prevent the semiconductor chips of the sub-semiconductor package from being tilted or warped with respect to the main substrate.

The gap-maintaining member comprises an adhesive element and beads, wherein each bead is formed to have a uniform size.

The beads are formed using any one of a metal, a ceramic, and a polymer.

The first and second semiconductor chips may comprise the same kind of semiconductor chips or different kinds of semiconductor chips.

The semiconductor package further comprises a molding member for encapsulating the second semiconductor chip.

Ball lands are formed on the main substrate and are connected to the connection pads.

First bumps are interposed between the second line parts and the first bonding pads, and second bumps are interposed between the third line parts and the second bonding pads.

Any one of an anisotropic conductive paste, a non-conductive film, an anisotropic conductive film, and a polymer is interposed between each of the semiconductor chips and the sub-substrate body.

The sub-substrate body comprises a flexible substrate for tap-bonding the sub-connection pads formed on the sub-substrate body to the connection pads of the main substrate, by bending a portion of the sub-substrate body.

DESCRIPTION OF SPECIFIC EMBODIMENTS

Figure 1:
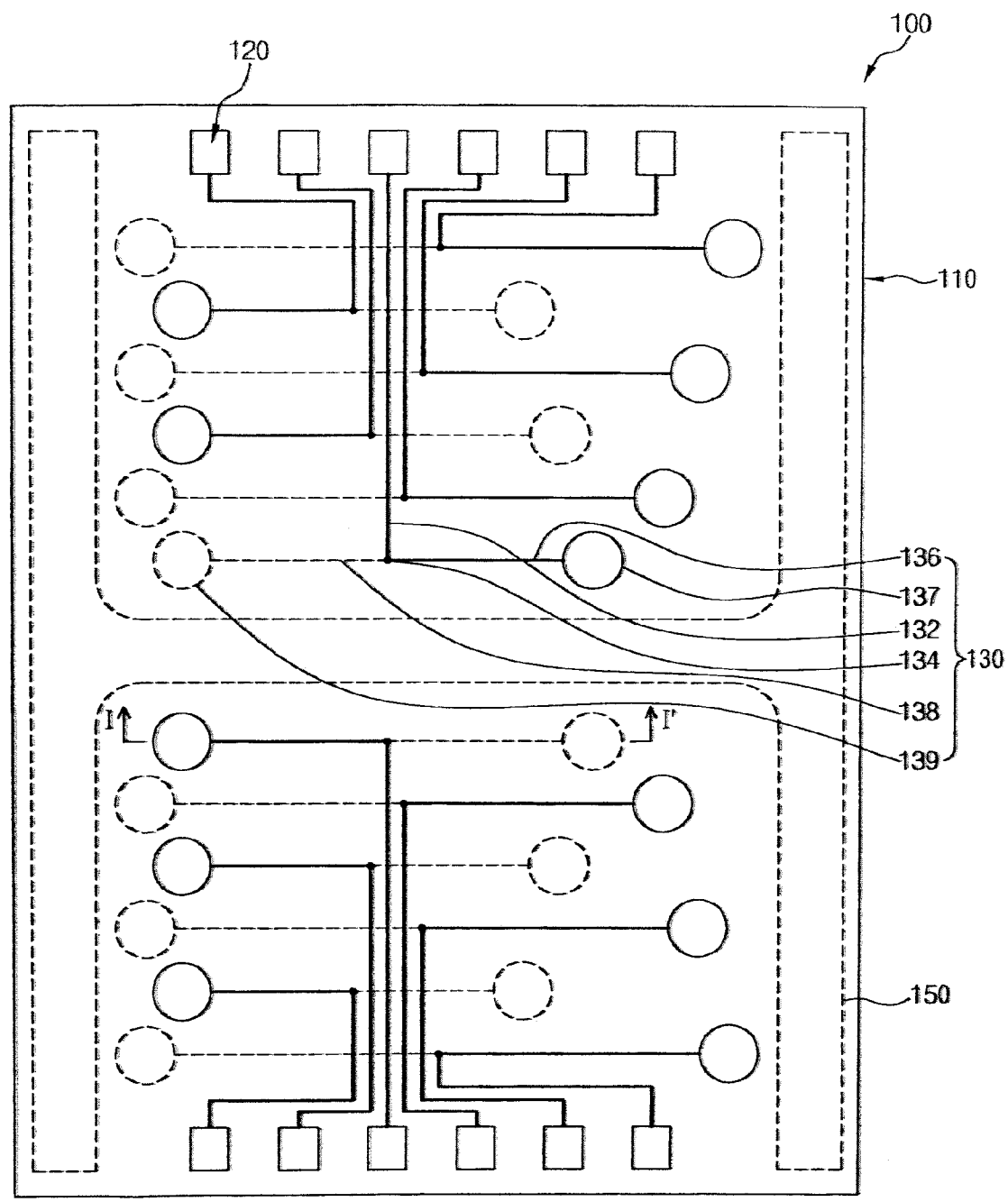
FIG. 1 is a plan view illustrating the upper surface of a substrate for a semiconductor package in accordance with an embodiment of the present invention.
Figure 2:
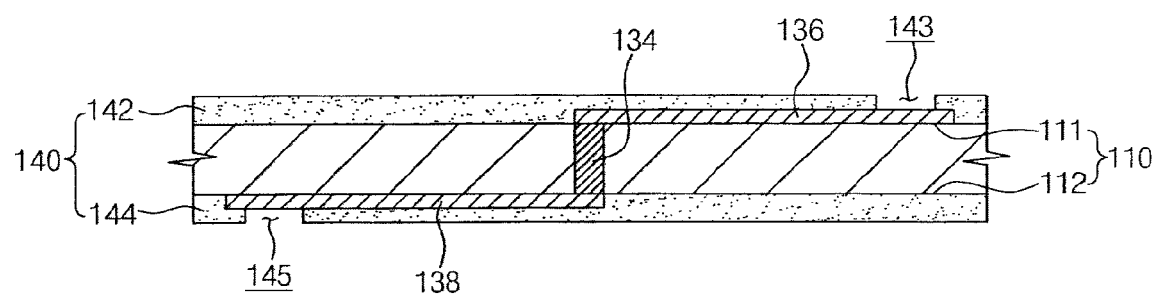
FIG. 2 is a cross-sectional view taken along the line I-I' of FIG. 1.
Figure 3:
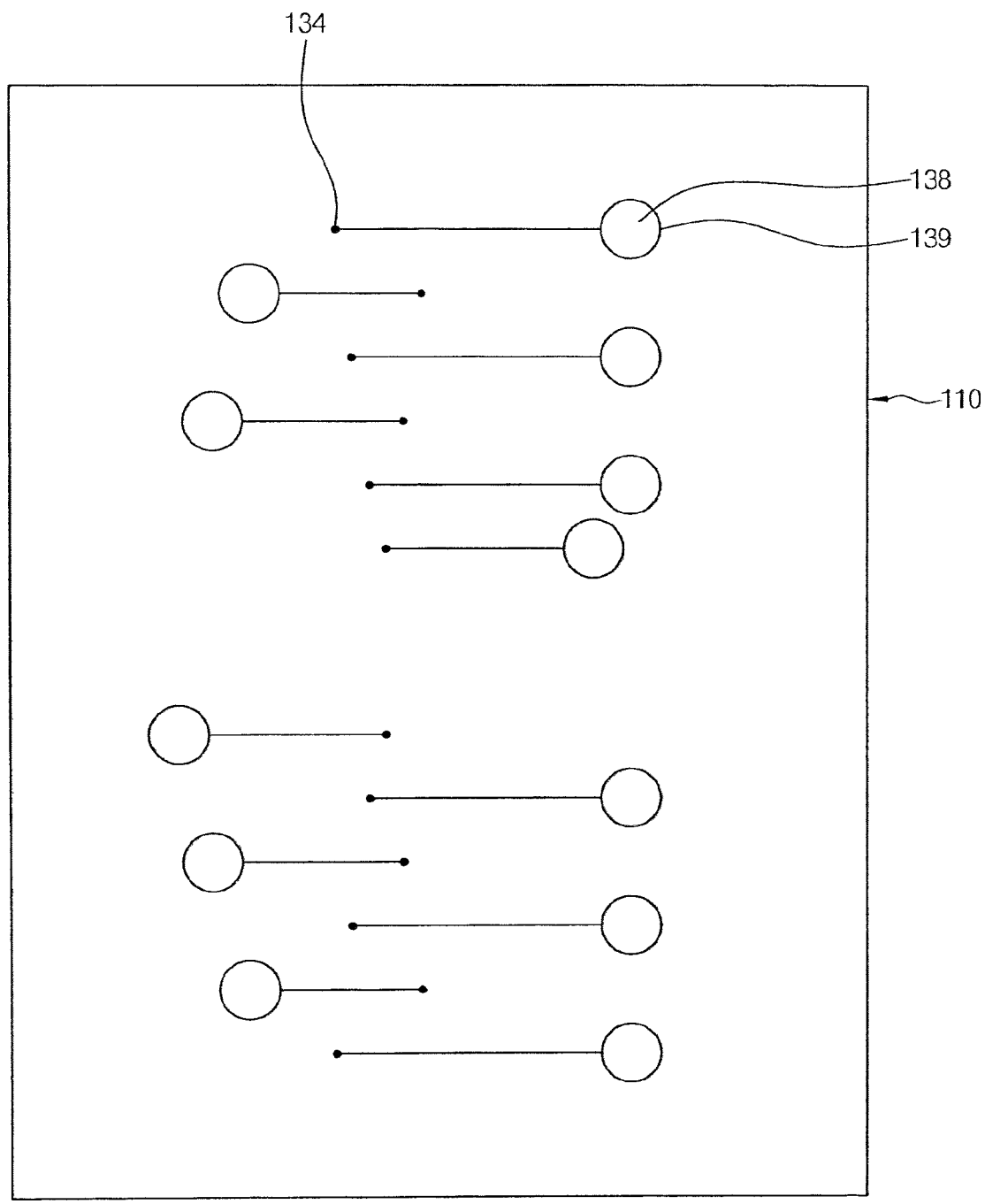
FIG. 3 is a bottom view illustrating the lower surface of the substrate for a semiconductor package, which faces away from the upper surface shown in FIG. 1.

FIG. 1 is a plan view illustrating the upper surface of a substrate for a semiconductor package in accordance with an embodiment of the present invention. FIG. 2 is a sectional view taken along the line I-I' of FIG. 1. FIG. 3 is a bottom view illustrating the lower surface of the substrate for a semiconductor package, which faces away from the upper surface shown in FIG. 1.

Referring to FIGS. 1 through 3, a substrate 100 for a semiconductor package includes a substrate body 110, connection pads 120, and signal lines 130. The reference numeral 150 in FIG. 1 designates a power line through which power is supplied.

In the present embodiment, the substrate body 110, for example, may be a printed circuit board (PCB) having a planar shape. As shown in FIG. 2, the substrate body 110 has a first surface 111 and a second surface 112 opposite the first surface 111. Alternatively, the substrate body 110 may be a flexible substrate, which can be bent.

The connection pads 120 are formed on the first surface 111 of the substrate body 110. For example, the plurality of connection pads 120 are formed in a row on the first surface 111 along an edge of the first surface 111. Two rows of connection pads 120 can be formed on two opposite edges of the first surface 111 of the substrate body 110.

The signal lines 130 have first line parts 132, conductive vias 134, second line parts 136, and third line parts 138.

Each first line part 132 having a first end and a second end is formed on the first surface 111 of the substrate body 110. The first end of each first line part 132 is connected to a predetermined one of the connection pads 120. The first line parts 132 are then routed so that the first line parts 132 extend toward and along the central portion of the upper half of the first surface 111 as shown in FIG. 1, and the second ends of the first line parts 132 also end in the central portion of the upper half the first surface 111 as shown in FIG. 1.

Because the second ends of the first line parts 132 extend toward and along the central portion of the upper half of the substrate body 110, each pair of the second and third line parts 136 and 138, connected to the same first line part 132 (which will be described below in detail) can be formed to have substantially the same wiring length and/or the same wiring area.

Each of the first line parts 132 is connected to the predetermined one of connection pads 120 and is routed on the first surface of the substrate such that all first line parts 132 can have substantially the same length as shown in FIG. 1. The second ends of the first line parts 132 are formed at different positions along the central portion of the upper half of the substrate body 110 because each of the first line parts 132 has been formed to have substantially the same length as shown in FIG. 1.

The first line parts 132 may be formed of any of a number of conductive materials, such as copper.

Referring to FIG. 2, each of the conductive vias 134 pass through the first surface 111 and the second surface 112 of the substrate body 110. For example, each of the conductive vias 134 are connected to a predetermined one of the second ends of the first line parts 132. The conductive vias 134 may be formed of any of a number of conductive materials, such as copper. The conductive vias 134 may be formed along the middle portion of the substrate body 110 or near to an edge of the substrate body 110.

Each second line part 136, having a first end and a second end, is formed on the first surface 111 of the substrate body 110. The first end of each second line part 136 is connected to a predetermined one of the conductive vias 134 which are exposed on the first surface 111 of the substrate body 110.

According to the present invention, each second line part 136 may also be connected directly to a predetermined one of the first line parts 132.

The signal lines 130 include first ball lands 137. Each first ball land 137 is formed on the second end of a predetermined one of the second line parts 136. For example, the second line parts 136 and the first ball lands 137 may be integrally formed with each other. Solders may be placed on the first ball lands 137.

The second line parts 136 may be formed of any of a number of conductive materials, such as copper.

Referring to FIG. 3, each third line part 138, having a first end and a second end, is formed on the second surface 112 of the substrate body 110, which faces away from the first surface 111.

The first end of each third line part 138 is connected to a predetermined one of the conductive vias 134 which are exposed on the second surface 112 of the substrate body 110. As noted above, the third line parts 138 and the second line parts 136 have substantially the same length. Also, the third line parts 138 may have substantially the same wiring area as the second line parts 136. Further, each third line part 138 may be formed in a mirror image with respect to a predetermined one of the second line parts 136 when viewed from the positions of the conductive vias 134.

FIG. 2 shows the mirror image layout described above. A second line part 136 and a third line part 138, each connected to a common conductive via 134, extend in opposite directions when viewed from the position of the conductive via.

The signal lines 130 include second ball lands 139. Each second ball land 139 is formed on the second end of a predetermined one of the third line parts 138. For example, the third line parts 138 and the second ball lands 139 may be integrally formed with each other, and solders may be formed on the second ball lands 139.

The third line parts 138 may be formed of any of a number of conductive materials, such as copper.

Referring again to FIG. 2, the substrate 100 for a semiconductor package may further include a solder resist pattern 140.

The solder resist pattern 140 includes a first solder resist pattern 142 and a second solder resist pattern 144.

The first solder resist pattern 142 is formed on the first surface 111 of the substrate body 110, and includes first openings 143 formed to correspond to each of the connection pads 120 and the first ball lands 137.

The second solder resist pattern 144 is formed on the second surface 112 of the substrate body 110, and includes second openings 145 formed to correspond to each of the second ball lands 139.

Figure 4:
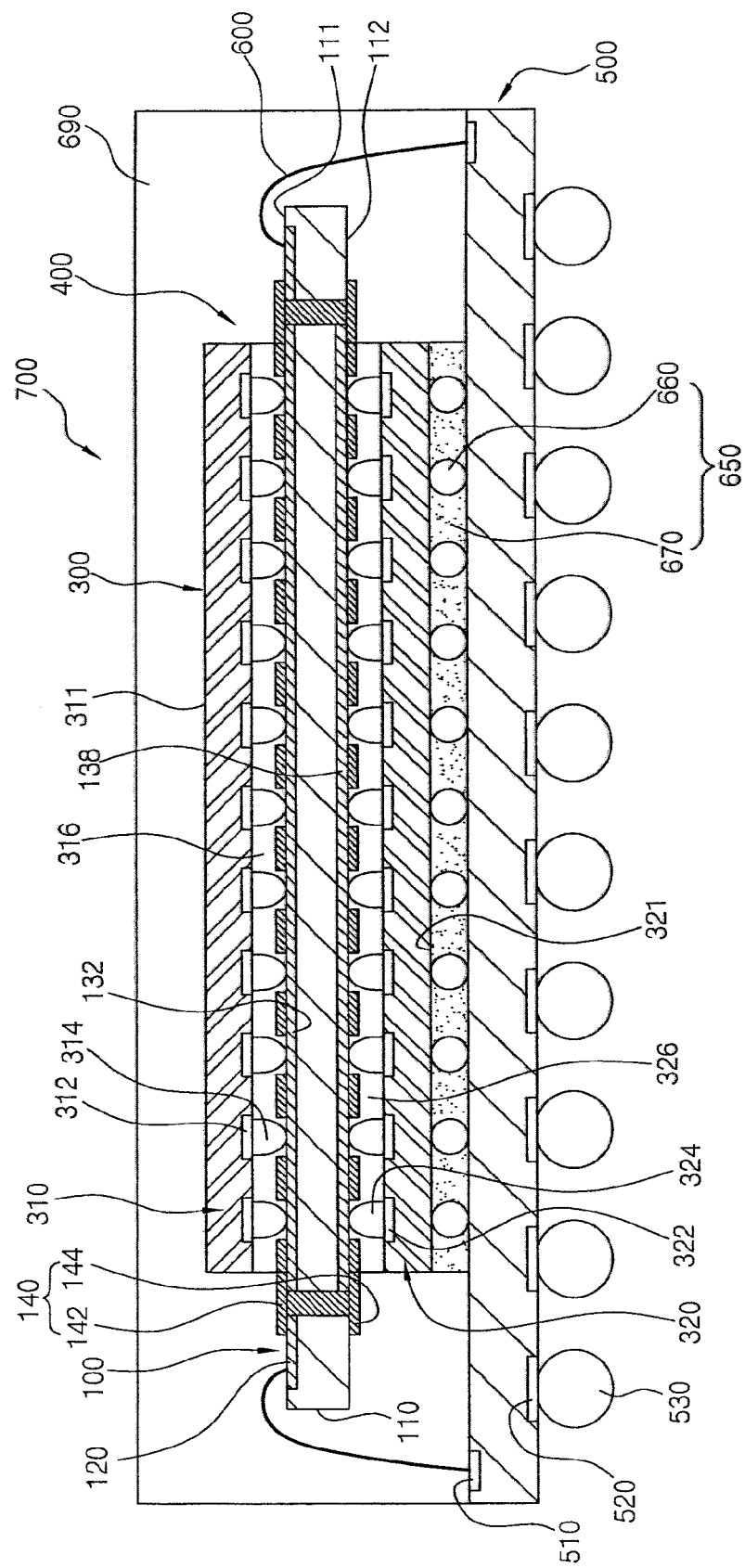
FIG. 4 is a cross-sectional view illustrating a semiconductor package in accordance with another embodiment of the present invention.
Figure 5:
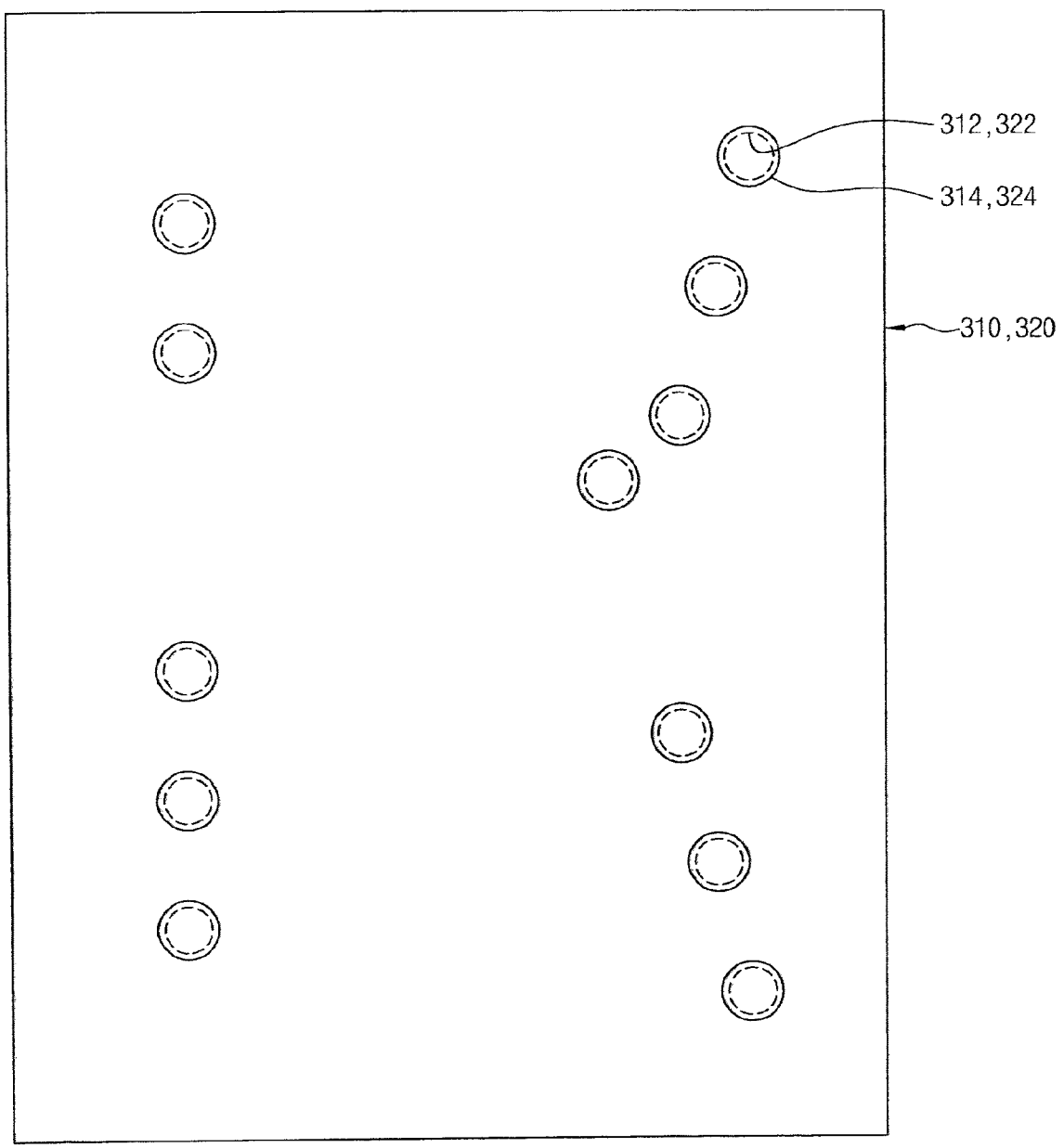
FIG. 5 is a plan view illustrating the semiconductor chips shown in FIG. 4.

FIG. 4 is a sectional view illustrating a semiconductor package in accordance with another embodiment of the present invention. FIG. 5 is a plan view illustrating the semiconductor chips shown in FIG. 4.

Referring to FIG. 4, a semiconductor package 700 includes a sub-semiconductor package 400 and a main substrate 500. Additionally, the semiconductor package 700 may include conductive connection members 600 and a gap-maintaining member 650.

The sub-semiconductor package 400 includes semiconductor chips 300 and a sub-substrate 100.

Referring to FIGS. 4 and 5, the semiconductor chips 300 include, for example, a first semiconductor chip 310 and a second semiconductor chip 320.

The first semiconductor chip 310 includes a first semiconductor chip body 311, first bonding pads 312 and first bumps 314.

The first semiconductor chip body 311 includes a circuit section (not shown). For example, the circuit section may include a data storage part (not shown) for storing data and a data processing part (not shown) for processing data.

The first bonding pads 312 are formed on the first semiconductor chip body 311 and are connected to the circuit section. In the present embodiment, the first bonding pads 312 may be irregularly spaced or arranged on the first semiconductor chip body 311, or the first bonding pads 312 may be regularly spaced or arranged on the first semiconductor chip body 311 as shown in FIG. 5.

The first bumps 314 are connected to the first bonding pads 312. The first bumps 314 may be directly formed on the first bonding pads 312. According to the present invention, the first bumps 314 may also be formed on re-distribution lines (not shown) which are connected to the first bonding pads 312.

The second semiconductor chip 320 has a second semiconductor chip body 321, second bonding pads 322 and second bumps 324.

The second semiconductor chip body 321 has a circuit section (not shown). For example, the circuit section may include a data storage part (not shown) for storing data and a data processing part (not shown) for processing data.

The second bonding pads 322 are formed on the second semiconductor chip body 321 and are connected to the circuit section. In the present embodiment, the second bonding pads 322 may be regularly or irregularly spaced or arranged on the second semiconductor chip body 321 as shown in FIG. 5. In the present embodiment, the placement of the second bonding pads 322 is substantially the same as the placement of the first bonding pads 312 of the first semiconductor chip 310.

The second bumps 324 are connected to the second bonding pads 322 which have substantially the same placement as the first bonding pads 312. The second bumps 324 may be directly formed on the second bonding pads 322, or the second bumps 324 may be formed on re-distribution lines (not shown) which are connected to the second bonding pads 322.

In the present embodiment, the first semiconductor chip 310 and the second semiconductor chip 320 may be the same kind of semiconductor chips. According to the present invention, the first and second semiconductor chips 310 and 320 are attached to the first and second surface 111 and 112 of the sub-substrate body 110. Therefore, the first and second semiconductor chips 310 and 320 face each other, and consequently, the first bumps 314 and the second bumps 324 also face each other. The first and second bumps 314 and 324, which face each other, are formed in a mirror image, or in other words, each first bump 314 is formed to correspond to a predetermined one of the second bumps 324. According to the present invention, the first semiconductor chip 310 and the second semiconductor chip 320 may also be different kinds of semiconductor chips.

Referring to FIGS. 1 and 4, the sub-substrate 100 includes a sub-substrate body 110, sub-connection pads 120 and signal lines 130.

The sub-substrate body 110 may be a PCB and have a planar shape. The sub-substrate body 110 has a first surface 111 and a second surface 112 on the opposite side of the first surface.

The plurality of sub-connection pads 120 are formed on the first surface 111 of the sub-substrate body 110. For example, the plurality of sub-connection pads 120 are formed in a row on the first surface 111 along an edge of the first surface 111. Two rows of sub-connection pads 120 can be formed on two opposite edges on the first surface 111 of the sub-substrate body 110.

The signal lines 130 have first line parts 132, conductive vias 134, second line parts 136, and third line parts 138.

Each first line part 132, having a first end and a second end, is formed on the first surface 111 of the sub-substrate body 110. The first end of each first line part 132 is connected to a predetermined one of the sub-connection pads 120. The first line parts 132 are then routed so that the first line parts 132 extend toward and along the central portion of the upper half of the first surface 111, as shown in FIG. 1, and the second ends of the first line parts 132 also end in the central portion of the upper half of the first surface 111 of the sub-substrate body 110.

Because the second ends of the first line parts 132 extend toward and along the central portion of the upper half of the of the sub-substrate body 110, the second and third line parts 136 and 138, connected to the same first line part 132, (which will be described below in detail), may be formed to have substantially the same wiring length and/or the same wiring area.

Each of the first line parts 132, is connected to the predetermined one of the sub-connection pads 120 and is routed on the first surface of the sub-substrate such that each first line part can have substantially the same length. The second ends of the first line parts 132 are formed at different positions along the central portion of the upper half of the sub-substrate body 110 because each of the first line parts 132 has been formed to have substantially the same length as shown in FIG. 1.

Each of the conductive vias 134 pass through both the first surface 111 and the second surface 112 of the sub-substrate body is 110. For example, each of the conductive vias 134 are connected to a predetermined one of the second ends of the first line parts 132. The conductive vias 134 may be formed along the middle portion of the sub-substrate body 110 or near to an edge of the sub-substrate body 110.

Each second line part 136, having a first end and a second end, is formed on the first surface 111 of the sub-substrate body 110. The first end of each second line part 136 is connected to a predetermined one of the conductive vias 134 which are exposed on the first surface 111 of the sub-substrate body 110. According to the present invention each second line part 136 may also be connected directly to a predetermined one of the first line parts 132.

The signal lines 130 include first ball lands 137. Each first ball land 137 is formed on the second end of a predetermined one of the second line parts. For example, the second line parts 136 and the first ball lands 137 may be integrally formed with each other. Solders may be formed on the first ball lands 137.

The third line parts 138 are formed on the second surface 112 of the sub-substrate body 110, which faces away from the first surface 111.

The first ends of each third line part 138 is connected to a predetermined one of the respective conductive vias 134 which are exposed on the second surface 112 of the sub-substrate body 110. As discussed above, the third line parts 138 and the second line parts 136 have substantially the same length. Also, the third line parts 138 may have substantially the same wiring area as the second line parts 136. Further, each third line part 138 may be formed in a mirror image with respect to the second line parts 136 when viewed from the positions of the conductive vias 134. FIG. 2 shows the mirror image layout described above. A second line part 136 and a third line part 138, each connected to a common conductive via 134, extend in opposite directions when viewed from the position of the conductive via.

The signal lines 130 include second ball lands 139. Each second ball lands 139 is formed on the second end of a predetermined one of the third line parts 138. For example, the third line parts 138 and the second ball lands 139 may be integrally formed with each other, and solders may be formed on the second ball lands 139.

The third line parts 138 may be formed of any of a number of materials, such as copper.

Referring to FIGS. 2 and 4, the sub-substrate 100 may further include a solder resist pattern 140.

The solder resist pattern 140 includes a first solder resist pattern 142 and a second solder resist pattern 144.

The first solder resist pattern 142 is formed on the first surface 111 of the sub-substrate body 110, and includes first openings 143 formed to correspond to each of the sub-connection pads 120 and the first ball lands 137.

The second solder resist pattern 144 is formed on the second surface 112 of the sub-substrate body 110, and includes second openings 145 formed to correspond to each of the second ball lands 139.

It was described above in the present embodiment that the sub-substrate body 110 is a PCB. However, according to the present invention, the sub-substrate body 110 may include a flexible substrate for tap-bonding the sub-connection pads 120, formed on the sub-substrate body 110, to the connection pads of the main substrate (which will be described below) by bending a portion of the sub-substrate body 110.

Referring again to FIG. 4, the first ball lands 137 are formed on the first surface 111 of the sub substrate 100 at positions corresponding to the first bumps 314 of the first semiconductor chip 310. Likewise, the second ball lands 139 are formed on the second surface 112 of the sub-substrate 100 at positions corresponding to the second bumps 324 of the second semiconductor chip 320.

The first bumps 314 of the first semiconductor chip 310 are connected to the first ball lands 137, and the second bumps 324 of the second semiconductor chip 320 are connected to the second ball lands 139.

Meanwhile, a first under-fill member 316 may be formed between the first semiconductor chip 310 and the sub-substrate 100. The first under-fill member 316 may comprise an anisotropic conductive paste, a non-conductive film, or an anisotropic conductive film.

Likewise, a second under-fill member 326 may be formed between the second semiconductor chip 320 and the sub-substrate 100. The second under-fill member 326 may comprise an anisotropic conductive paste, a non-conductive film, an anisotropic conductive film, or a polymer.

In the present embodiment, the second semiconductor chip 320 and the second surface 112 of the sub-substrate body 110 may be selectively molded by a molding member (not shown). The molding member functions to firmly support the sub-connection pads 120 when conductive wires are wire-bonded to the sub-connection pads 120 of the sub-substrate body 110.

Referring again to FIG. 4, the main substrate 500 supports the sub-semiconductor package 400 having the semiconductor chips 300 and the sub-substrate 100.

The main substrate 500 includes connection pads 510 and ball lands 520, and may further include solder balls 530 which are attached to the ball lands 520.

Meanwhile, connection members, such as conductive balls or conductive bumps, may be formed to connect the signal lines 130 of the sub-substrate 100 to the connection pads 510 of the main substrate 500.

For example the main substrate 500 may be a PCB having a planar shape.

The connection pads 510 are formed on the upper surface of the main substrate 500, which faces the sub-semiconductor package 400, and the ball lands 520 are formed on the lower surface of the main substrate 500, which faces away from the upper surface.

The ball lands 520 are connected with both the connection pads 510 and the solder balls 530.

The conductive connection members 600 connect the connection pads 510 of the main substrate 500 to the sub-connection pads 120 of the sub-semiconductor package 400.

As shown in FIG. 4, the conductive connection members 600 may be conductive wires, which connect the connection pads 510 of the main substrate 500 to the sub-connection pads 120 of the sub-semiconductor package 400. The conductive connection members 600 may also be conductive pins, which pass through the sub-connection pads 120 of the sub-semiconductor package 400, and connect the sub-connection pads 120 to the connection pads 510 of the main substrate 500. The conductive connection members 600 may also be conductive balls or conductive bumps that connect the sub-connection pads 120 of the sub-semiconductor package 400 to the connection pads 510 of the main substrate 500.

Referring again to FIG. 4, the gap-maintaining member 650 is interposed between the main substrate 500 and the sub-semiconductor package 400. The gap-maintaining member 650 prevents the semiconductor chips 300 included in the sub-semiconductor package 400 from being warped or from being tilted with respect to the main substrate 500. The gap-maintaining member 650 also attaches the sub-semiconductor package 400 to the main substrate 500.

If the sub-semiconductor package 400 is tilted on the main substrate 500 the lengths of the conductive connection members 600 that connect the sub-connection pads 120 of the sub-semiconductor package 400 and the connection pads 510 of the main substrate 500 become different on each side of the sub-semiconductor package 400. As a result, the high speed operation of the sub-semiconductor package 400 is likely to be adversely influenced.

According to the present invention, the gap-maintaining member 650 maintains a uniform gap between the main substrate 500 and the sub-semiconductor package. The gap-maintaining unit of the present invention prevents the semiconductor chips 300 of the sub-semiconductor package 400 from being tilted with respect to the main substrate 500.

The gap-maintaining member 650 includes beads 660 and an adhesive element 670.

The beads 660 are formed to have a uniform size in order to maintain the uniform gap between the main substrate 500 and the sub-semiconductor package 400. Examples of a material suitable for the beads 600 include a metal, a ceramic or a polymer, etc.

The adhesive element 670 secures the beads 660 at predetermined positions and attaches the sub-semiconductor package 400 to the main substrate 500.

In the present embodiment, the gap-maintaining member 650 also functions to support the high speed operation of the semiconductor package 700. This is accomplished because the gap-maintaining member 650 prevents tilting or warping of the sub-semiconductor package 400, thereby assuring the connection members will not have the different lengths.

Figure 6:
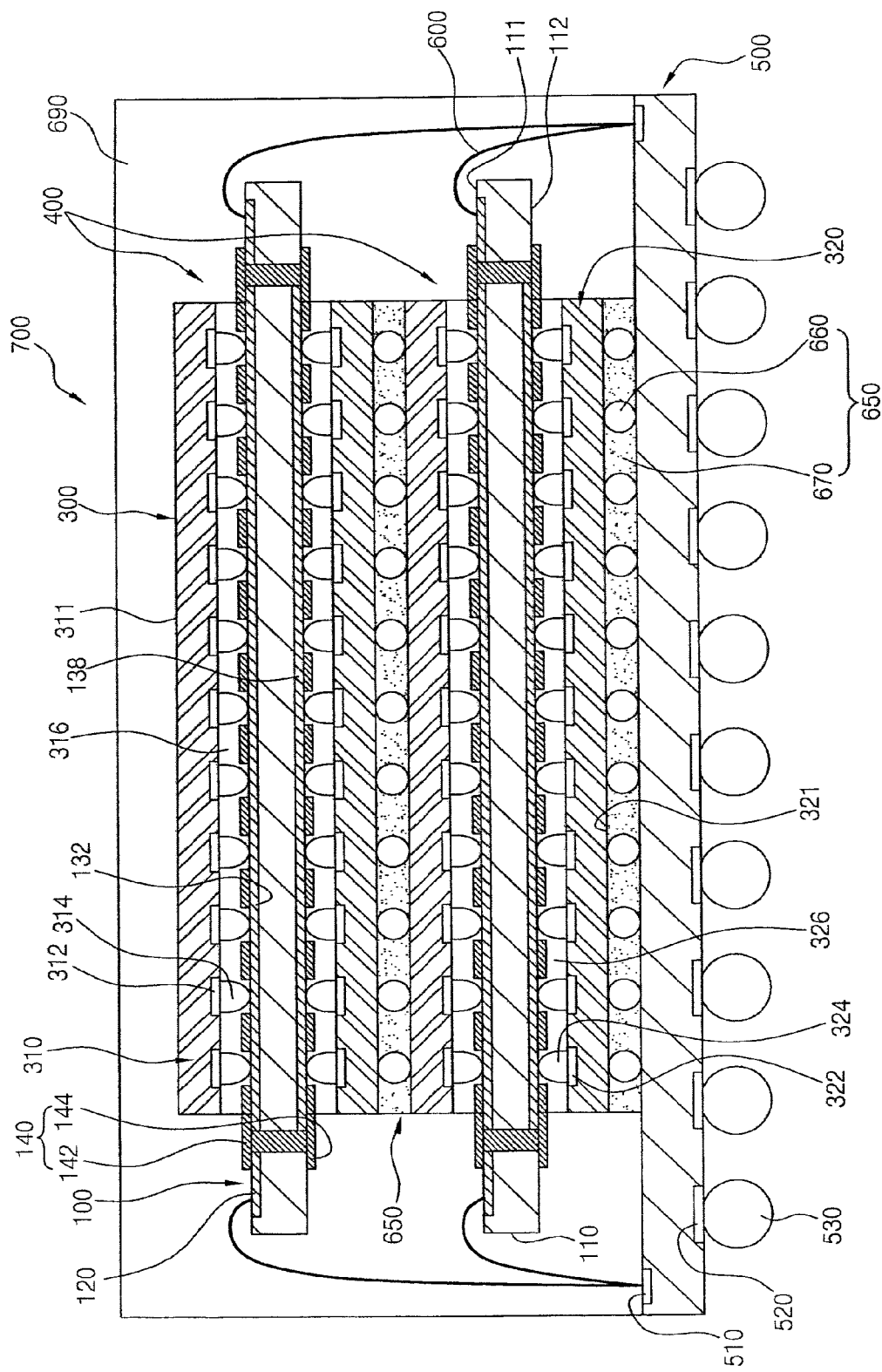
FIG. 6 is a cross-sectional view illustrating a semiconductor package in accordance with still another embodiment of the present invention.

It was described and illustrated above that a single sub-semiconductor package 400 may be formed on the main substrate 500. However, according to the present invention at least two sub-semiconductor packages 400 may be stacked on the main substrate 500, and gap-maintaining members 650 may be interposed between the stacked sub-semiconductor packages 400, as shown in FIG. 6.

In this case, the sub-semiconductor packages 400 formed on the main substrate 500 may be molded by a molding member including a molding material such as epoxy resin.

The present invention provides advantages by considerably decreasing the differences in the lengths of signal lines for inputting and outputting signals to and from semiconductor chips, therefore, a semiconductor package of the present invention may operate at a high speed.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a sub-semiconductor package including semiconductor chips and a sub-substrate, the semiconductor chips comprising:
a first semiconductor chip which has first bonding pads facing a first surface of the sub-substrate; and
a second semiconductor chip which has second bonding pads facing a second surface of the sub-substrate, wherein the second bonding pads are formed to directly correspond and align with the first bonding pads;
the sub-substrate comprising:
a sub-substrate body having a first surface and a second surface on the opposite side of the first surface wherein the sub-substrate body is interposed between the first and second bonding pads
a plurality of sub-connection pads formed along a first edge of the first surface of the sub-substrate body;
a plurality of signal lines, each signal line comprising:
a first line part formed on the first surface of the sub-substrate body and connected to a sub-connection pad;
a conductive via connected to the first line part and passing through the sub-substrate body;
a second line part formed on the first surface of the sub-substrate body connected to a first bonding pad and the conductive via; and
a third line part formed on the second surface of the sub-substrate body connected a second bonding pad and the conductive via;
a power line formed such that a first portion of the power line extends laterally along a second edge of the first surface of the sub-substrate body which is adjacent and connected to the first edge of the first surface of the sub-substrate body, a second portion of the power line extends laterally along a third edge of the first surface of the sub-substrate body opposite the second edge, and a third portion of the power line connects the first portion of the power line and the second portion of the power line such that the power line has an "H" shape; and
a main substrate supporting the sub-semiconductor package and having connection pads which are connected to the sub-connection pads.

2. The semiconductor package according to claim 1, wherein each of the first line parts extend toward a central portion of first surface of the sub-substrate body.

3. The semiconductor package according to claim 1, wherein each second line part is formed to connect to a predetermined one of the conductive vias and each second line part extends along the first surface of the sub-substrate body, and the third line part connected to the predetermined one of the conductive vias extends along the second surface of the sub-substrate body in the opposite direction.

4. The semiconductor package according to claim 1, wherein the sub-semiconductor package further includes:
   a plurality of first ball lands formed on the first surface of the sub-substrate body, wherein each first ball land is formed on an end of a predetermined one of the second line parts; and
   a plurality of second ball lands formed on the second surface of the sub-substrate body, wherein each second ball land is formed on an end of a predetermined one of the third line parts.

5. The semiconductor package according to claim 4, wherein the sub-semiconductor package further includes:
   a first solder resist pattern formed on the first surface of the sub-substrate body and having first openings formed to correspond to each of the sub-connection pads and each of the first ball lands; and
   a second solder resist pattern formed on the second surface of the sub-substrate body and having second openings formed to correspond to each of the second ball lands.

6. The semiconductor package according to claim 1, wherein the sub-connection pads of the sub-substrate are connected to the connection pads of the main substrate by conductive connection members.

7. The semiconductor package according to claim 6, wherein each conductive connection member comprises any one of a conductive wire, a conductive pin, a conductive ball and, a conductive bump.

8. The semiconductor package according to claim 1, further comprising:
   a gap-maintaining member interposed between the main substrate and the sub-semiconductor package to prevent the semiconductor chips of the sub-semiconductor package from being tilted or warped with respect to the main substrate.

9. The semiconductor package according to claim 8, wherein the gap-maintaining member comprises an adhesive element and beads, wherein each bead is formed to have a uniform size.

10. The semiconductor package according to claim 9, wherein the beads are formed using any one of a metal, a ceramic, and a polymer.

11. The semiconductor package according to claim 1, wherein the first and second semiconductor chips are the same kind of semiconductor chips.

12. The semiconductor package according to claim 1, wherein the first and second semiconductor chips are different kinds of semiconductor chips.

13. The semiconductor package according to claim 1, further comprising:
   a molding member for encapsulating the second semiconductor chip.

14. The semiconductor package according to claim 1, wherein ball lands are formed on the main substrate and are connected to the connection pads.

15. The semiconductor package according to claim 1, wherein first bumps are interposed between the second line parts and the first bonding pads, and second bumps are interposed between the third line parts and the second bonding pads.

16. The semiconductor package according to claim 15, wherein any one of an anisotropic conductive paste, a non-conductive film, an anisotropic conductive film, and a polymer is interposed between each of the semiconductor chips and the sub-substrate body.

17. The semiconductor package according to claim 1, wherein the sub-substrate body comprises a flexible substrate for tap-bonding the sub-connection pads formed on the sub-substrate body to the connection pads of the main substrate, by bending a portion of the sub-substrate body.

* * * * *